US012787457B2

(12) United States Patent
Esteki et al.

(10) Patent No.: US 12,787,457 B2
(45) Date of Patent: Nov. 3, 2026

(54) PHOTODETECTOR WITH ENHANCED ULTRA VIOLET LIGHT SENSITIVITY

(71) Applicant: Vishay Semiconductor GmbH, Heilbronn (DE)

(72) Inventors: Ardeshir Esteki, Aachen (DE); Christoph Gebauer, Heilbronn (DE); Heinrich Gottlob, Nordheim (DE); Max Lemme, Cologne (DE)

(73) Assignee: Vishay Semiconductor GmbH, Heilbronn (DE)

( * ) Notice: Subject to any disclaimer, the term of this patent is extended or adjusted under 35 U.S.C. 154(b) by 179 days.

(21) Appl. No.: 18/527,936

(22) Filed: Dec. 4, 2023

(65) Prior Publication Data

US 2025/0185385 A1 Jun. 5, 2025

(51) Int. Cl.

*H10F 30/10* (2025.01)
*H10F 71/00* (2025.01)
*H10F 77/20* (2025.01)

(52) U.S. Cl.

CPC ........... *H10F 30/10* (2025.01); *H10F 71/121* (2025.01); *H10F 77/20* (2025.01)

(58) Field of Classification Search

CPC ........ H10F 30/10; H10F 71/121; H10F 77/20; H10F 77/241; H10F 30/227; H10F 77/244

See application file for complete search history.

(56) References Cited

U.S. PATENT DOCUMENTS

| | | | | |
|---|---|---|---|---|
| 2014/0299841 | A1* | 10/2014 | Nourbakhsh | H10D 30/47 257/29 |
| 2017/0057827 | A1* | 3/2017 | Sultana | G02B 26/04 |
| 2020/0064323 | A1 | 2/2020 | Doshi et al. | |
| 2020/0075791 | A1* | 3/2020 | Chan | H10F 77/206 |
| 2020/0350443 | A1* | 11/2020 | Lee | H10F 77/331 |
| 2023/0282759 | A1* | 9/2023 | Ogawa | H10F 77/122 250/338.4 |

(Continued)

FOREIGN PATENT DOCUMENTS

| | | | |
|---|---|---|---|
| CN | 104157720 | A | 11/2014 |
| CN | 104300027 | A | 1/2015 |
| CN | 112201704 | A | 1/2021 |

OTHER PUBLICATIONS

Wan Xia et al., "A self-powered high-performance graphene/silicon ultraviolet photodetector with ultra-shallow junction: breaking the limit of silicon?", NPJ 2D Materials and Applications, vol. 1, 4, Apr. 11, 2017, pp. 1-8.

(Continued)

*Primary Examiner* — Uzma Alam
*Assistant Examiner* — Richard O Toohey
(74) *Attorney, Agent, or Firm* — Volpe Koenig

(57) ABSTRACT

A photodetector and method of making the same including a semiconductor and a 2D material. The space charge region is located directly at the surface of the semiconductor. A photon with a small wavelength, once it enters the semiconductor, is immediately inside the space charge region in which an electron-hole pair generated by the photon can contribute to a photocurrent. This makes the photodetector an efficient UV detector. Interdigitated oxide structures between the semiconductor and the 2D material further enhance the sensitivity of the photodetector to, for example, UV light.

20 Claims, 13 Drawing Sheets

(56) References Cited

U.S. PATENT DOCUMENTS

| | | | | |
|---|---|---|---|---|
| 2024/0243141 | A1* | 7/2024 | Meng | H10F 30/227 |
| 2025/0145884 | A1* | 5/2025 | Park | H10F 77/1433 |

OTHER PUBLICATIONS

Yin Jun et al., "Engineered tunneling layer with enhanced impact ionization for detection improvement in graphene/ silicon heterojunction photodetectors", Light: Science & Applications, vol. 10, 113, May 31, 2021, pp. 1-10.

Liu Lixiang et al, "Graphene Nanofilms/Silicon Near-Infrared Avalanche Photodetectors", Jun. 20, 2022 (Jun. 20, 2022), vol. {0} 21, p. 307-310,.

International Search Report and Written Opinion for International Application No. PCT/EP2024/084137 dated Mar. 12, 2025, 16 pages long.

* cited by examiner

FIG. 14
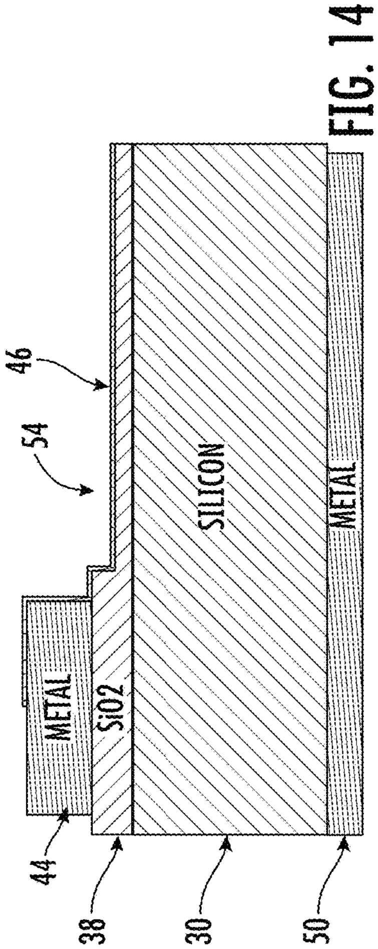
FIG. 15
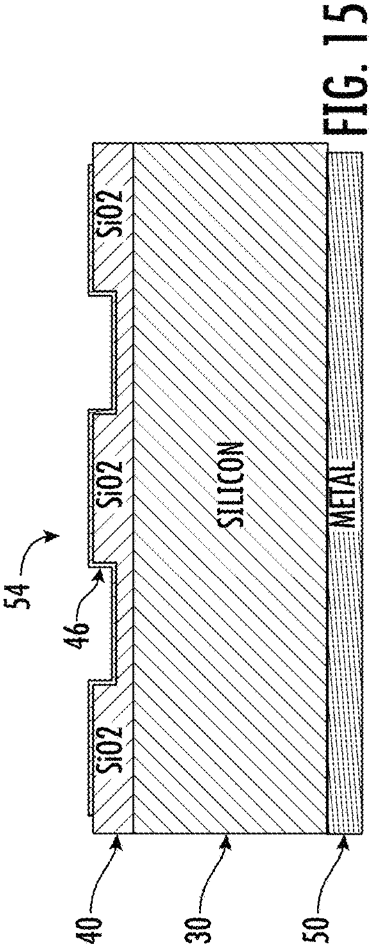
FIG. 16
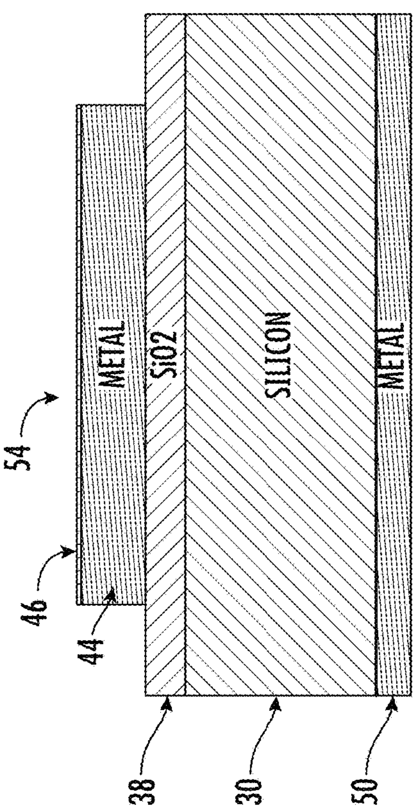
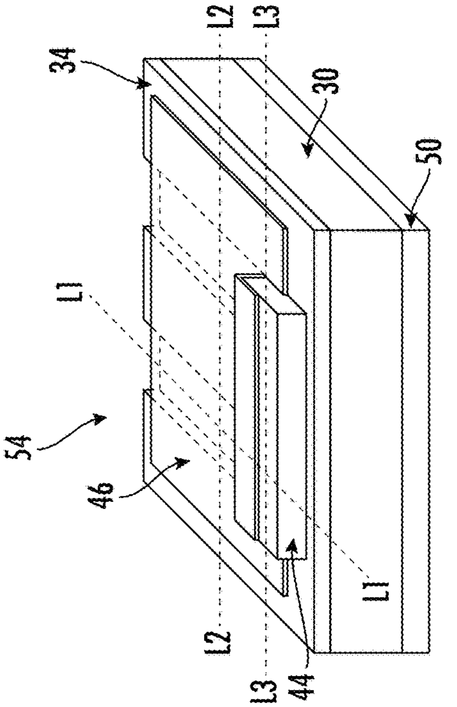
FIG. 13

PHOTODETECTOR WITH ENHANCED ULTRA VIOLET LIGHT SENSITIVITY

FIELD OF THE INVENTION

The present disclosure relates to sensing devices in general, and more particularly, to photodetectors for sensing ultraviolet light.

BACKGROUND

Silicon photodetectors are devices that convert light into electrical signals. Such devices are widely used in optical communication and imaging, for example. Some silicon photodetectors are based on Schottky diodes. A Schottky diode includes a heavily-doped semiconductor substrate, typically made of single-crystal silicon. A second layer covers the substrate. The second layer, which may be referred to as the drift region, is less heavily-doped with a material having carriers of the same conducting type as the substrate. A metal layer or a metal silicide layer forms a Schottky contact with the lightly-doped drift region and forms the diode anode.

The penetration depth of light in some semiconductors, e.g. silicon, depends on its wavelength. For silicon, blue light is absorbed close to the surface while infrared light deeply penetrates the material. Standard silicon photodetectors have their p-n junction (where the space charge region is created and a generated electron-hole pair can contribute to a photocurrent) buried in the material. This makes conventional silicon photodetectors inefficient detectors for ultra-violet (UV) light, which has a low probability to reach the p-n junction as it gets absorbed by silicon on the surface. Thus, for ultraviolet (UV) light detection, expensive silicon carbide (SiC) photodetectors are typically used.

There is accordingly a need for a photodetector having a space charge region at a more optimal location than in known semiconductor devices.

There is also a need for a photodetector with increased efficiency due to the positioning of the space charge region.

There is also a need for a photodetector with increased efficiency due to the use and positioning of 2D materials.

SUMMARY OF THE INVENTION

Aspects of the present disclosure are directed to a photodetector and method of making the same comprising a semiconductor and a two-dimensional (2D) material (e.g., graphene, MoS2, PtSe2, WS2). 2D materials may be single-layer or multi-layer (although with very few layers) materials. 2D materials may be crystalline solids that are one to just a few atoms thick. Such materials tend to be strong, flexible, lightweight, and good conductors of electricity and heat. Graphene is a well-known 2D material.

One advantage of a photodetector in accordance with the present disclosure is that the space charge region is located directly at the surface of the semiconductor. A photon with a small wavelength, once it enters the semiconductor, is immediately inside the space charge region in which an electron-hole pair generated by the photon can contribute to a photocurrent. Accordingly, a photodetector in accordance with the present disclosure is an efficient UV detector. Interdigitated oxide structures between the semiconductor and the 2D material further enhance the sensitivity of the photodetector to, for example, UV light. In accordance with one aspect of the present disclosure, an optoelectronic semiconductor device comprises a semiconductor substrate, a patterned silicon oxide layer on a first side of the semiconductor substrate, a top contact on the oxide layer, a graphene layer on at least portions of each of the silicon oxide layer, the semiconductor substrate, and the top contact, and a bottom contact on a second side of the semiconductor substrate opposite the first side.

The insulating layer or silicon oxide layer can include a patterned structure, having a plurality of raised or elevated areas with gaps or channels in between the raised areas. A top contact can be positioned on a selected surface a raised area the patterned structure. The semiconductor substrate can include a lowly (or low) n-doped silicon (which may be considered a "drift layer"), and the oxide layer may comprise silicon oxide. The semiconductor substrate can alternatively include highly n-doped silicon or lowly or highly p-doped silicon. The silicon oxide layer can comprise a thermally grown silicon oxide layer having a thickness of approximately 20 nm. At least one of the top contact or bottom contact can include a Ti layer having a thickness of approximately 20 nm and a Ni layer having a thickness of approximately 200 nm. A thin layer of insulation is provided in one or more of the gaps or channels provided between the raised areas. The thin layer of insulation can comprise a thin silicon oxide layer.

The silicon oxide layer can include an interdigitated patterned structure. The interdigitated patterned structure can include a connecting portion extending in a first direction and a plurality of fingers extending in a second direction from the connecting portion, wherein the second directions is essentially perpendicular to the first direction. The top contact can be positioned on a surface of the connecting portion of the interdigitated patterned structure. The top contact can be spaced apart from at least two fingers of the interdigitated patterned structure in the second direction. The semiconductor substrate can include a lowly (or low) n-doped silicon (which may be considered a "drift layer"), and the oxide layer may comprise silicon oxide. The semiconductor substrate can alternatively include highly n-doped silicon or lowly or highly p-doped silicon. The silicon oxide layer can comprise a thermally grown silicon oxide layer having a thickness of approximately 20 nm. At least one of the top contact or bottom contact can include a Ti layer having a thickness of approximately 20 nm and a Ni layer having a thickness of approximately 200 nm. The optoelectronic semiconductor device can include a header, and one of the top contact or bottom contact can be wire bonded to the header.

In accordance with another aspect of the present disclosure, a method of forming an optoelectronic semiconductor device comprises forming an oxide layer on a first side of a semiconductor substrate, the oxide layer including a patterned structure, forming a top contact on the oxide layer, forming a 2D material layer on at least portions of each of the semiconductor substrate, the oxide layer and the top contact, and forming a bottom contact on a second side of the semiconductor substrate opposite the first side.

Forming the oxide layer can include thermally growing a silicon oxide layer on a silicon semiconductor substrate. The method can include using optical lithography and wet etching to remove portions of the silicon oxide layer to form the patterned structure. Forming the top contact can include sputtering at least one metal on the oxide layer. Sputtering at least one metal layer can include sputtering a Ti layer having a thickness of approximately 20 nm and a Ni layer having a thickness of an approximately 200 nm. Forming the 2D material layer can include growing a graphene layer on copper by chemical vapor deposition and dry transferring the graphene layer onto at least portions of each of the semiconductor substrate, the oxide layer and the top contact. The method can include patterning the graphene layer. Patterning the graphene layer can include reactive ion etching. Forming the bottom contact can include sputtering a metal on the second side of the semiconductor substrate.

The insulating layer may be patterned in different shapes or arrangements, such as an interdigitated arrangement, a spiral, a grid or "net," a triangular or angled pattern, or other patterns where the insulating layer has raised areas separated by gaps or channels. The pattern of the insulating layer may have straight, angled, or curved or arced or arcing areas, or a combination of any of those. A thin insulation layer is provided in the gaps or channels.

According to aspects of the disclosure, an optoelectronic semiconductor device is provided comprising a semiconductor substrate. An insulating layer comprising a patterned structure is provided on a first side of the semiconductor substrate. The patterned structure may comprise a plurality of raised areas with at least one channel formed between adjacent raised areas. A layer of an insulating material may be provided on a surface of at least one of the channels. A first contact may be positioned on a surface of one of the raised areas. At least one 2D material layer may be provided on at least portions of each of the insulating layer and the semiconductor substrate, the 2D material layer in contact with the first contact. A second contact provided on a second side of the semiconductor substrate.

An optoelectronic semiconductor device according to aspects of the disclosure may further be provided wherein the insulating layer comprises an oxide layer.

An optoelectronic semiconductor device according to aspects of the disclosure may further be provided wherein the layer of insulating material provided on the surface of the at least one channel comprises an oxide layer.

An optoelectronic semiconductor device according to aspects of the disclosure may further be provided wherein the raised areas of the patterned structure have a first thickness, and the insulating material provided on the surface of at least one of the channels has a second thickness, and wherein the first thickness is greater than the second thickness.

An optoelectronic semiconductor device according to aspects of the disclosure may further be provided wherein the patterned structure comprises at least one of interdigitated fingers, triangular fingers, at least partially curved fingers, or a combination of any of those.

An optoelectronic semiconductor device according to aspects of the disclosure may further be provided wherein the patterned structure comprises a combination of fingers have a first shape type and having a second shape type different than the first shape type.

An optoelectronic semiconductor device according to aspects of the disclosure may further be provided wherein the semiconductor substrate comprises a n-doped silicon, and wherein the oxide layer comprises silicon oxide.

An optoelectronic semiconductor device according to aspects of the disclosure may further be provided wherein the oxide layer comprises a thermally grown silicon oxide layer having a thickness of about 20 nm.

An optoelectronic semiconductor device according to aspects of the disclosure may further be provided wherein at least one of the first contact or the second contact comprises a Ti layer having a thickness of about 20 nm, and a Ni layer having a thickness of about 200 nm.

An optoelectronic semiconductor device according to aspects of the disclosure may further be provided comprising a header, wherein one of the first contact or the second contact is wire bonded to the header.

An optoelectronic semiconductor device according to aspects of the disclosure may further be provided comprising a package, the package comprising a transparent material configured to allow transmission of light.

According to aspects of the disclosure, method of forming an optoelectronic semiconductor device, the method comprising: a semiconductor substrate; forming an insulating layer comprising a patterned structure provided on a first side of the semiconductor substrate, the patterned structure comprising a plurality of raised areas with at least one channel formed between adjacent raised areas; forming a layer of an insulating material on a surface of at least one of the channels; forming a first contact positioned on a surface of one of the raised areas; forming at least one 2D material layer on at least portions of each of the insulating layer and the semiconductor substrate, the 2D material layer in contact with the first contact; and forming a second contact provided on a second side of the semiconductor substrate.

A method of claim according to aspects of the invention may be provided wherein forming the insulating layer comprises a thermally grown a silicon oxide layer.

A method of claim according to aspects of the invention may be provided further comprising using optical lithography and wet etching to form the patterned structure.

A method of claim according to aspects of the invention may be provided wherein forming the first contact comprises sputtering at least one metal layer on the silicon oxide layer.

A method of claim according to aspects of the invention may be provided wherein sputtering at least one metal layer comprises sputtering a Ti layer having a thickness of about 20 nm, and sputtering a Ni layer having a thickness of about 200 nm.

A method of claim according to aspects of the invention may be provided wherein forming the 2D material layer comprises growing a graphene layer on copper by chemical vapor deposition and transferring the graphene layer onto at least portions of each of the semiconductor substrate, the silicon oxide layer and the first contact.

A method of claim according to aspects of the invention may be provided further comprising patterning the graphene layer.

A method of claim according to aspects of the invention may be provided wherein patterning the graphene layer comprises reactive ion etching.

A method of claim according to aspects of the invention may be provided further comprising providing a package enclosing at least a portion of the optoelectronic semiconductor device, the package comprising a transparent material configured to allow transmission of light.

BRIEF DESCRIPTION OF THE DRAWINGS

Embodiments of the invention are illustrated by way of example and not by way of limitation in the accompanying drawings and in which like reference numerals refer to similar elements.

FIG. 13 is a perspective view of a device in accordance with the present disclosure after a fifth process step of the method of FIG. 1.

FIG. 14 is a cross-sectional view taken along the line L1-L1 in FIG. 13.

FIG. 15 is a cross-sectional view taken along the line L2-L2 in FIG. 13.

FIG. 16 is a cross-sectional view taken along the line L3-L3 in FIG. 13.

DETAILED DESCRIPTION

Figure 1:
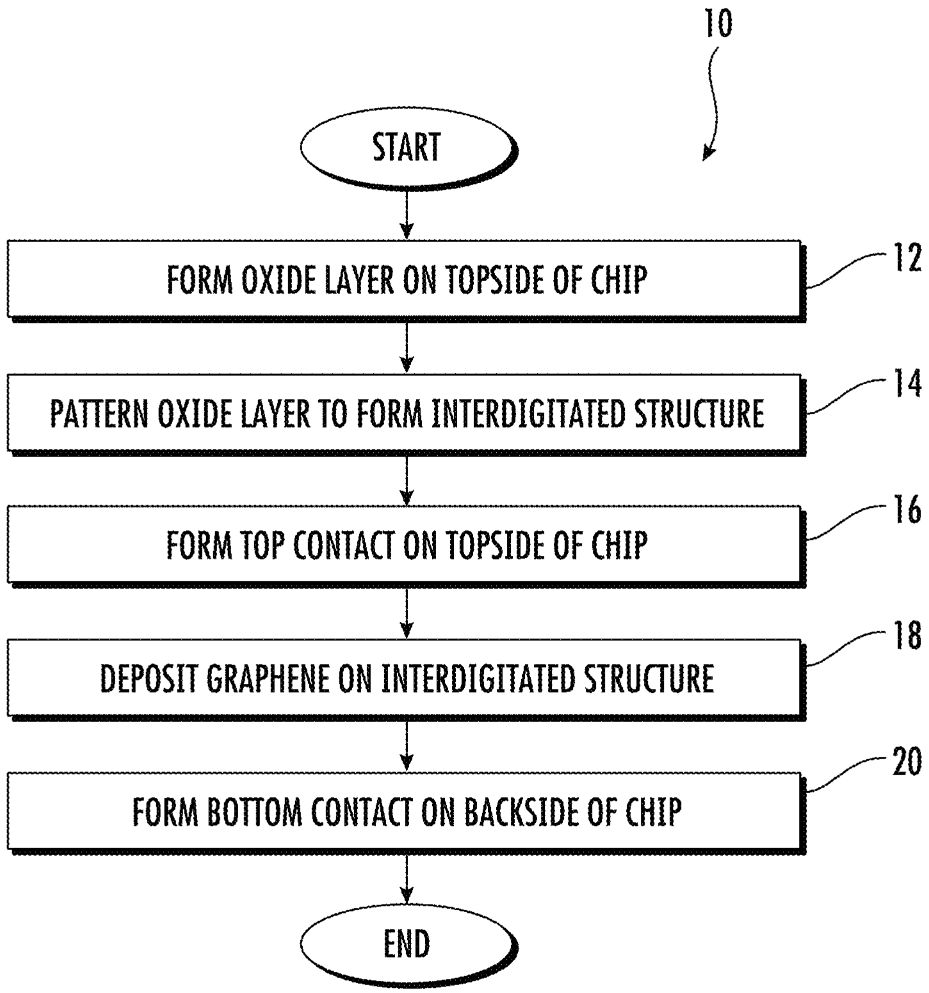
FIG. 1 is a flow chart illustrating an example method in accordance with the present disclosure.

The description provided herein is to enable those skilled in the art to make and use the described embodiments set forth. Various modifications, equivalents, variations, combinations, and alternatives, however, will remain readily apparent to those skilled in the art. Any and all such modifications, variations, equivalents, combinations, and alternatives are intended to fall within the spirit and scope of the present invention defined by claims.

Certain terminology is used in the following description for convenience only and is not limiting. The words "right," "left," "top," and "bottom" designate directions in the drawings to which reference is made. The words "a" and "one," as used in the claims and in the corresponding portions of the specification, are defined as including one or more of the referenced item unless specifically stated otherwise. This terminology includes the words above specifically mentioned, derivatives thereof, and words of similar import. The phrase "at least one" followed by a list of two or more items, such as "A, B, or C," means any individual one of A, B or C as well as any combination thereof.

Disclosed herein are embodiments of photodetector, and method of making the same, including a semiconductor and a 2D material comprising a Schottky diode. In a preferred embodiment, the 2D material is graphene. Due to graphene's transparency, light can enter the device, be absorbed in the space charge region of the semiconductor, directly on the surface of semiconductor, and generate an electron-hole pair that can contribute to a photocurrent.

One advantage of a photodetector in accordance with the present disclosure is that the space charge region is located directly at the surface of the semiconductor. A photon with a small wavelength, once it enters the semiconductor, is immediately inside the space charge region in which an electron-hole pair generated by the photon can contribute to a photocurrent. This makes a photodetector in accordance with the present disclosure an efficient UV detector. Interdigitated oxide structures between the semiconductor and the 2D material further enhance the sensitivity of the photodetector to, for example, UV light. Compared to conventional silicon photodetector devices, photodetector devices in accordance with the present disclosure have been shown to have 30% or greater photocurrent at 400 nm illumination and 100% or greater photocurrent at 260 nm illumination.

In FIG. 1, an exemplary method of forming a photodetector for sensing UV light in accordance with the present disclosure is identified generally by reference numeral 10. FIGS. 2-16 illustrate the resulting structures during the various steps of the method 10. It will be appreciated that FIGS. 2-14 illustrate formation of a single photodetector. In practice, however, an array of photodetectors may be formed on a semiconductor wafer (e.g., a silicon wafer) and then singulated for final assembly and/or integration with other components.

The method 10 begins with process step 12 wherein an insulating layer comprising patterned structure is formed on a semiconductor substrate. In the illustrated example, the insulating layer comprising an insulating material, such as silicon-oxide (SiO2) layer formed on a silicon substrate. In one example, the substrate is a lowly n-doped 2 cm×2 cm silicon chip and the SiO2 layer is a thermally grown SiO2 layer of approximately 20 nm. It will be appreciated that any suitable method of forming or depositing the SiO2 layer can be used, (e.g., native SiO2, SiO2 thermal growth, chemical vapor deposition, physical vapor deposition, etc.). It will further be appreciated that other semiconductor substrate materials can be utilized without departing from the scope of the present disclosure, such as GaN, GaAs or SiC, for example. In addition, it will be further appreciated that other insulating layer materials can be utilized without departing from the scope of the present disclosure, such as SiN.

Figure 2:
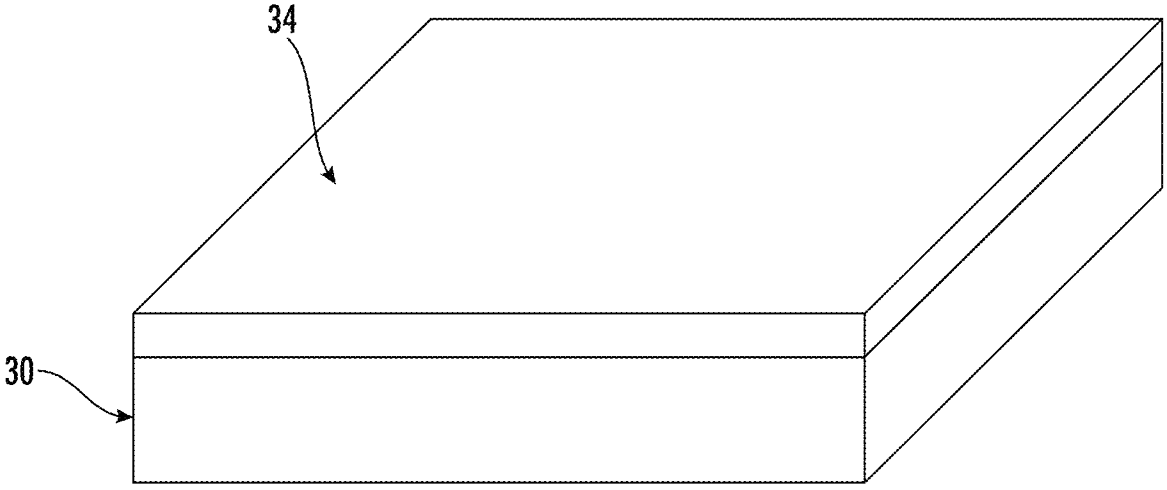
FIG. 2 is a perspective view of a partially-formed device in accordance with the present disclosure after a first process step of the method of FIG. 1.

FIG. 2 illustrates the silicon chip 30 (which may also be referred to as a semiconductor chip) and SiO2 layer 34 (the insulating layer) formed thereon in accordance with process step 12. The silicon chip 30 may have a thickness (or height) in the range of approximately 50 um (micrometers) to approximately 675 um, although it will be appreciated that any thickness can be utilized depending on a particular application. The SiO2 layer 34 may have a thickness in the range of approximately 2 nm to approximately 200 nm, for example, but other thickness are possible.

In process step 14, the SiO2 layer is patterned to form a patterned structure. In the example of FIGS. 2-14, the patterned structure is an interdigitated patterned structure 36. The patterning can be performed by any suitable method. In one example, optical lithography and wet etching are used to remove portions of the $SiO_2$ layer from the silicon chip 30.

Figure 4:
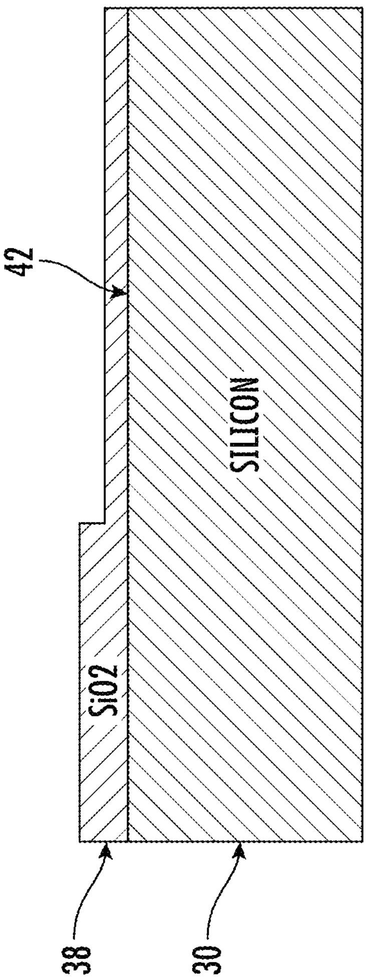
FIG. 4 is a cross-sectional view taken along the line L1-L1 in FIG. 3.
Figure 5:
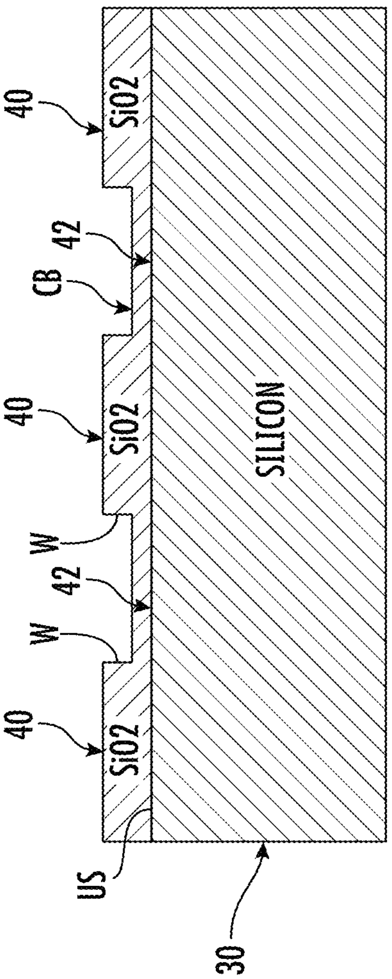
FIG. 5 is a cross-sectional view taken along the line L2-L2 in FIG. 3.
Figure 3:
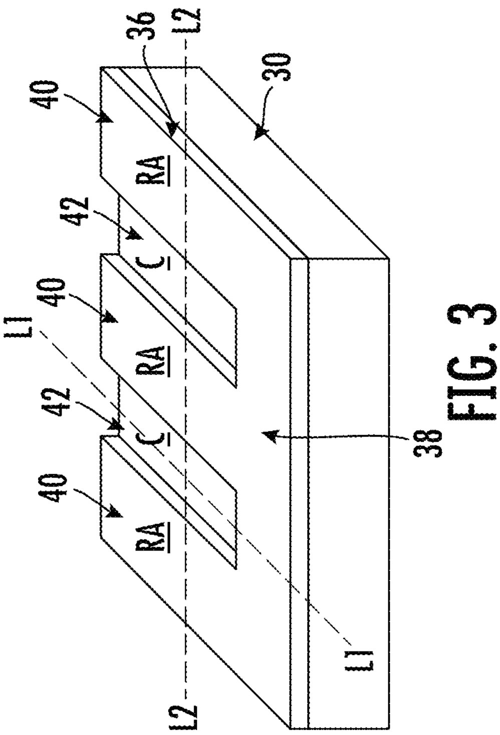
FIG. 3 is a perspective view of a partially-formed device in accordance with the present disclosure after a second process step of the method of FIG. 1.

FIGS. 3-5 illustrate the interdigitated patterned structure 36 atop the silicon chip 30 in accordance with process step 14. As shown, the interdigitated patterned structure 36 comprises one or more raised areas RA that extend above the upper surface US of the silicon chip 30. In between the raised areas RA are gaps or channels C. These channels C have walls W formed by the sides of adjacent raised areas RA on each side of the channel C and channel base CB. The channel base CB comprises a thin layer of the insulating material, that is in this example, a thin layer of the $SiO_2$. Thus, the patterned structure provides for alternating raised areas RA and channels C.

The interdigitated patterned structure 36 includes an optional connecting portion 38 running across a portion of the silicon chip and a plurality of spaced-apart finger portions 40 (or extensions) extending from the connector portion 38 in a common direction. The finger portions 40, as part of the raised area RA, preferably extend essentially or approximately perpendicularly to a longitudinal axis of the connecting portion 38. Between the finger portions 40 are exposed areas 42 of the semiconductor chip 30. The exposed areas 42 may have a layer of oxide, such as native $SiO_2$, $TiO_2$, $Al_2O_3$, or $HfO_2$, for example. Each finger portion 40 may have a thickness (or height) in the range of approximately 2 nm to approximately 200 nm.

In process step 16, a top metal contact (anode) is formed on at least a portion of a top of the interdigitated patterned structure 36. In one example, the top metal contact includes a Ti layer having a thickness of approximately 20 nm and a Ni layer having a thickness of approximately 200 nm sputtered on the top of the connecting portion 38. The top metal contact can be formed by other methods, such as metal etching or lift-off processes.

Figure 7:
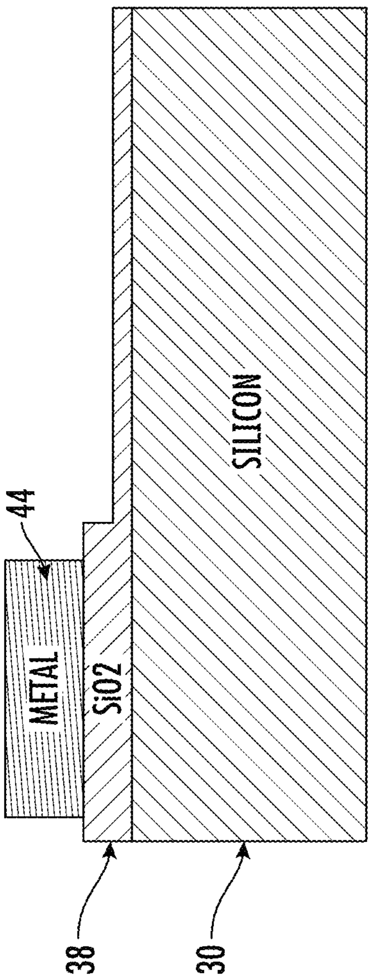
FIG. 7 is a cross-sectional view taken along the line L1-L1 in FIG. 6.
Figure 8:
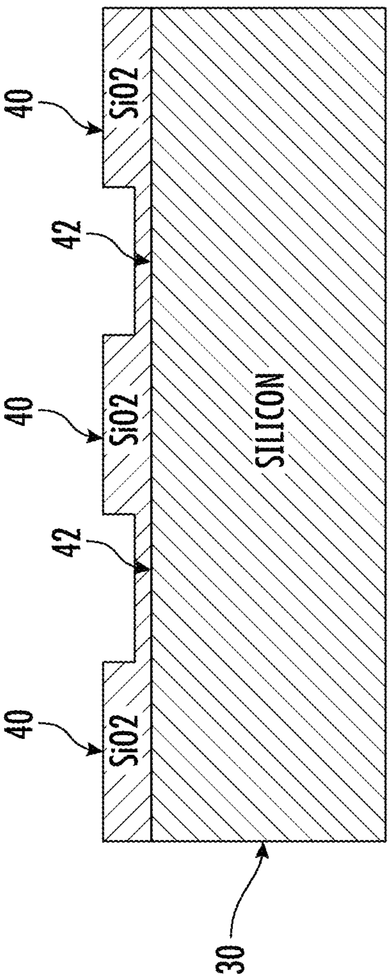
FIG. 8 is a cross-sectional view taken along the line L2-L2 in FIG. 6.
Figure 6:
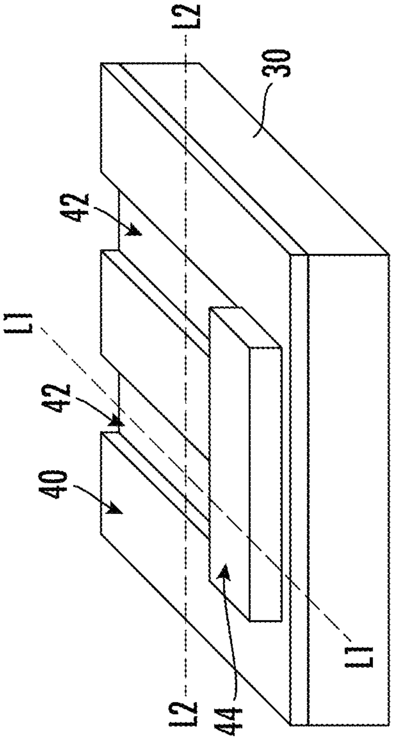
FIG. 6 is a perspective view of a partially-formed device in accordance with the present disclosure after a third process step of the method of FIG. 1.
Figure 10:
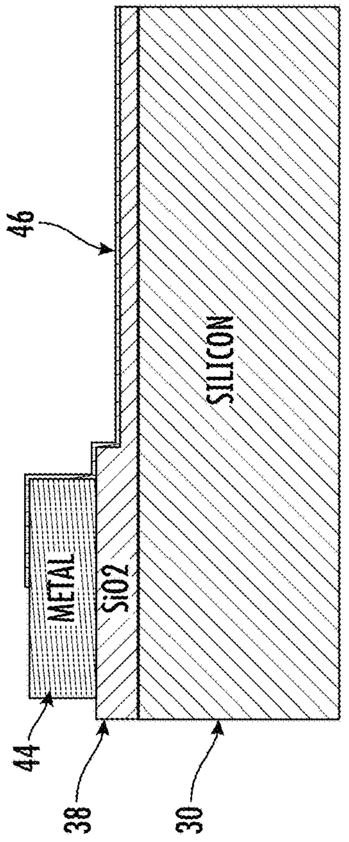
FIG. 10 is a cross-sectional view taken along the line L1-L1 in FIG. 9.
Figure 11:
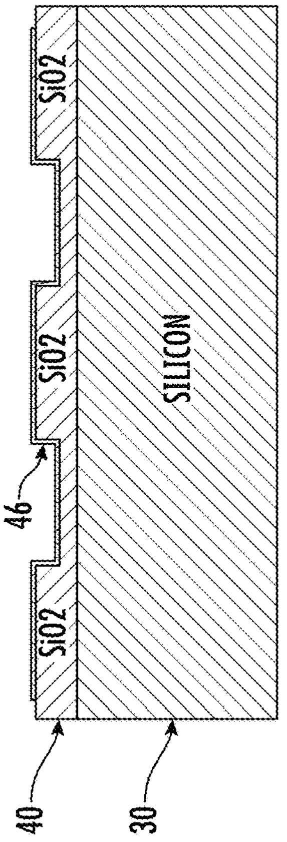
FIG. 11 is a cross-sectional view taken along the line L2-L2 in FIG. 9.
Figure 12:
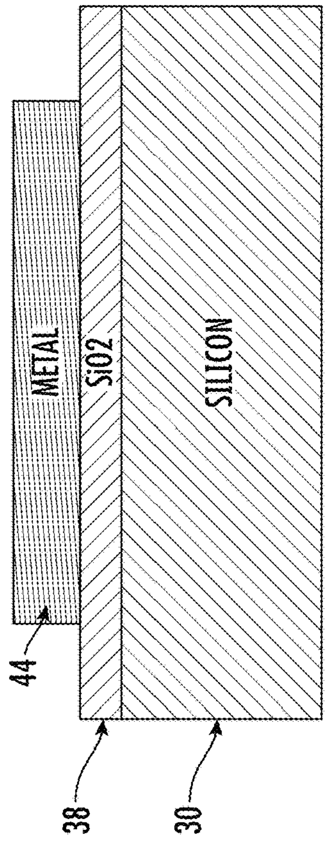
FIG. 12 is a cross-sectional view taken along the line L3-L3 in FIG. 9.
Figure 9:
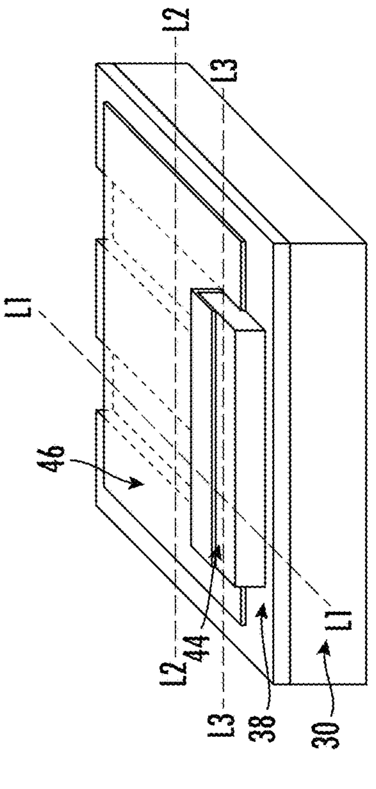
FIG. 9 is a perspective view of a partially-formed device in accordance with the present disclosure after a fourth process step of the method of FIG. 1.

FIGS. 6-8 illustrate the top metal contact 44 on the interdigitated patterned structure 36 in accordance with process step 16. The top metal contact 44 may only partially cover the upper surface of the interdigitated patterned structure 36. Although in the illustrated example the top metal contact 44 is formed on the interdigitated patterned structure 36, it could alternatively be formed on any insulator layer. In an aspect of the invention, the top metal contact 44 can be formed on a selected one of the finger portions 40. The top metal contact 44 may be formed having a thickness (or height) in the range of approximately 100 nm to approximately 10 um, a length in the range of approximately 100 μm and a width in the range of approximately 100 um.

In process step 18, a 2D material, for example graphene, is deposited, applied or otherwise formed on surfaces of the interdigitated patterned structure 36, at least a portion of the top metal contact 44 and exposed areas 42 of the silicon chip 30. Graphene is a single-layer hexagonal structure consisting of carbon atoms. Graphene is chemically and structurally stable, and exhibits desirable electrical and physical properties. For example, graphene has a charge mobility that is more than a hundred times faster than that of silicon. Graphene also has a current density of about 108 A/cm2, which is much greater than that of copper (Cu). It should be appreciated that the 2D material need only be in contact with the metal contact 44. In some embodiments, the 2D material may abut a side surface of the metal contact. In other embodiments, the metal contact 44 can be formed on top of the 2D layer.

In one example, the graphene can be grown on copper by chemical vapor deposition and then dry transferred onto the interdigitated patterned structure 36, the top metal contact 44 and exposed areas 42 of the silicon chip 30. In another example, the graphene can be grown directly on the interdigitated patterned structure 36, the top metal contact 44 and exposed areas 42 of the silicon chip 30.

FIGS. 9-12 illustrate the graphene layer 46 on the interdigitated patterned structure 36, the top metal contact 44 and exposed areas 42 of the silicon chip 30 in accordance with process step 18. The graphene layer 46 can be patterned by reactive ion etching. In some examples, multiple layers of graphene can be deposited on the interdigitated patterned structure 36, the top metal contact 44 and exposed areas 42 of the silicon chip 30. Other 2D materials can be used in place of or in addition to graphene.

Preferably, the graphene layer 46 covers an area including at least portions of, for example, the contact 44, the semiconductor chip 30, and the interdigitated patterned structure 36. In an aspect of the present disclosure, the contact 44 that contacts the graphene layer 46 does not also contact the silicon chip 30, that is, the graphene layer 46 resides on the insulator, such as the $SiO_2$ layer 34 formed as finger portions 40.

In some examples, a protective layer or coating can be applied on the structure. The protective layer can be applied to protect the device, particularly the graphene, from environmental influences like moisture, air or subsequent semiconductor process steps. The protective layer can be a polymer or a deposited material (e.g. an oxide or a nitride) or a photoresist. The protective layer typically at least covers the graphene, but it can also cover all other components of the device.

In process step 20, a bottom metal contact (cathode) is formed on the bottom of the silicon chip 30. In one example, the bottom metal contact includes a Ti layer having a thickness of about 20 nm and a Ni layer having a thickness of about 200 nm sputtered on the top of the connecting portion 38 using a lift-off process. It will be appreciated that all types of metal deposition processes can be used without departing from the scope of the present disclosure.

FIGS. 13-16 illustrate the bottom metal contact 50 on the bottom of the silicon chip 30 in accordance with process step 20. It should be appreciated that, in other examples, the cathode contact can be formed on a common side of the silicon chip 30 with the anode contact provided it is isolated from the anode contact and the graphene layer 46.

It will be appreciated that the process steps of the method 10 can be performed in different sequences. For example, the graphene layer 46 can be applied after formation of the top 44 and bottom 50 contacts.

Figure 17:
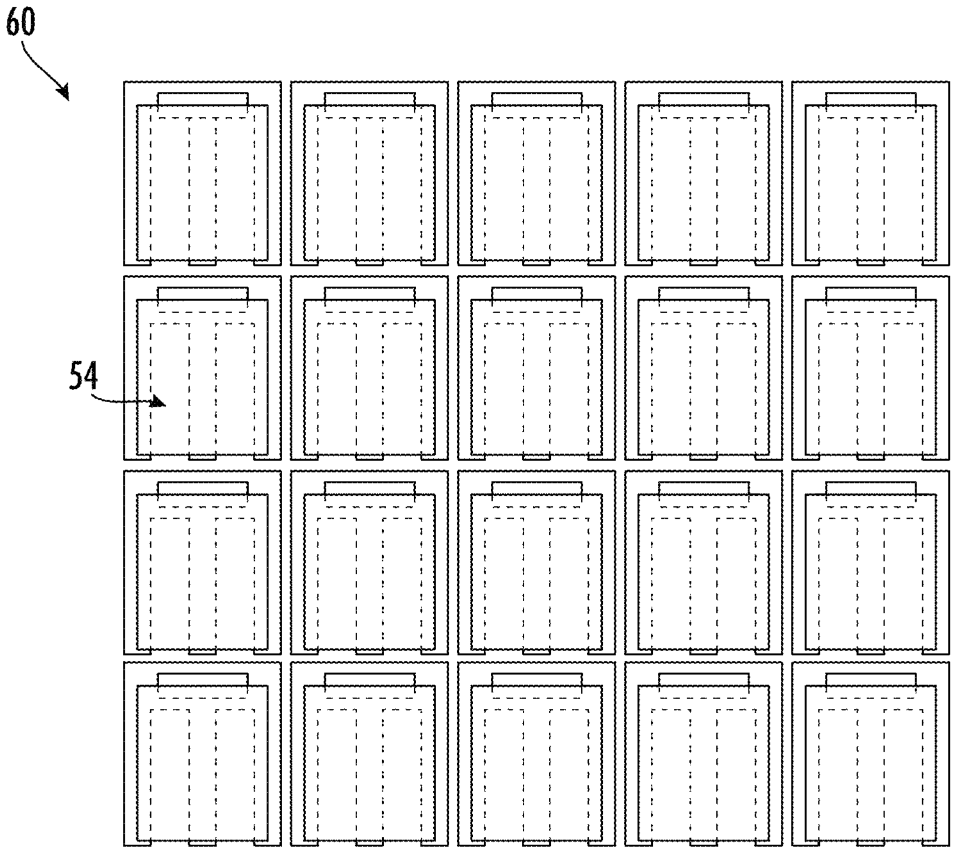
FIG. 17 is a plan view of an array of photodetectors in accordance with the present disclosure.

As noted above, an array 60 of photodetectors 54 are typically formed on a silicon wafer, as shown in FIG. 17. The photodetectors 54 may then be singulated by blade dicing and attached onto a Transistor Outline (TO) header via conductive silver epoxy. One of the contacts 44 or 50 is wire bonded to the header. A metal frame is assembled about the photodetector 54 and TO header and a commercial polymer is used to encapsulate the combined structures.

It will be appreciated that the interdigitated patterned structure of the illustrated example is exemplary in nature, and that other patterned structures can be utilized in place of or in addition to the interdigitated patterned structure 36. For example, a patterned structure comprising a plurality of concentric rings of an insulating material layer separated by exposed areas of the semiconductor chip could be used in place of the interdigitated patterned structure 36. As another example, a patterned structure comprising a grid of insulating material defined by exposed areas of the semiconductor chip could also be used. In still other examples, the patterned structure can be omitted such that the insulating material layer is continuous on the semiconductor chip. Examples of such alternative patterned structures are shown in FIGS. 18A-C and 19A-C.

Figure 18A:
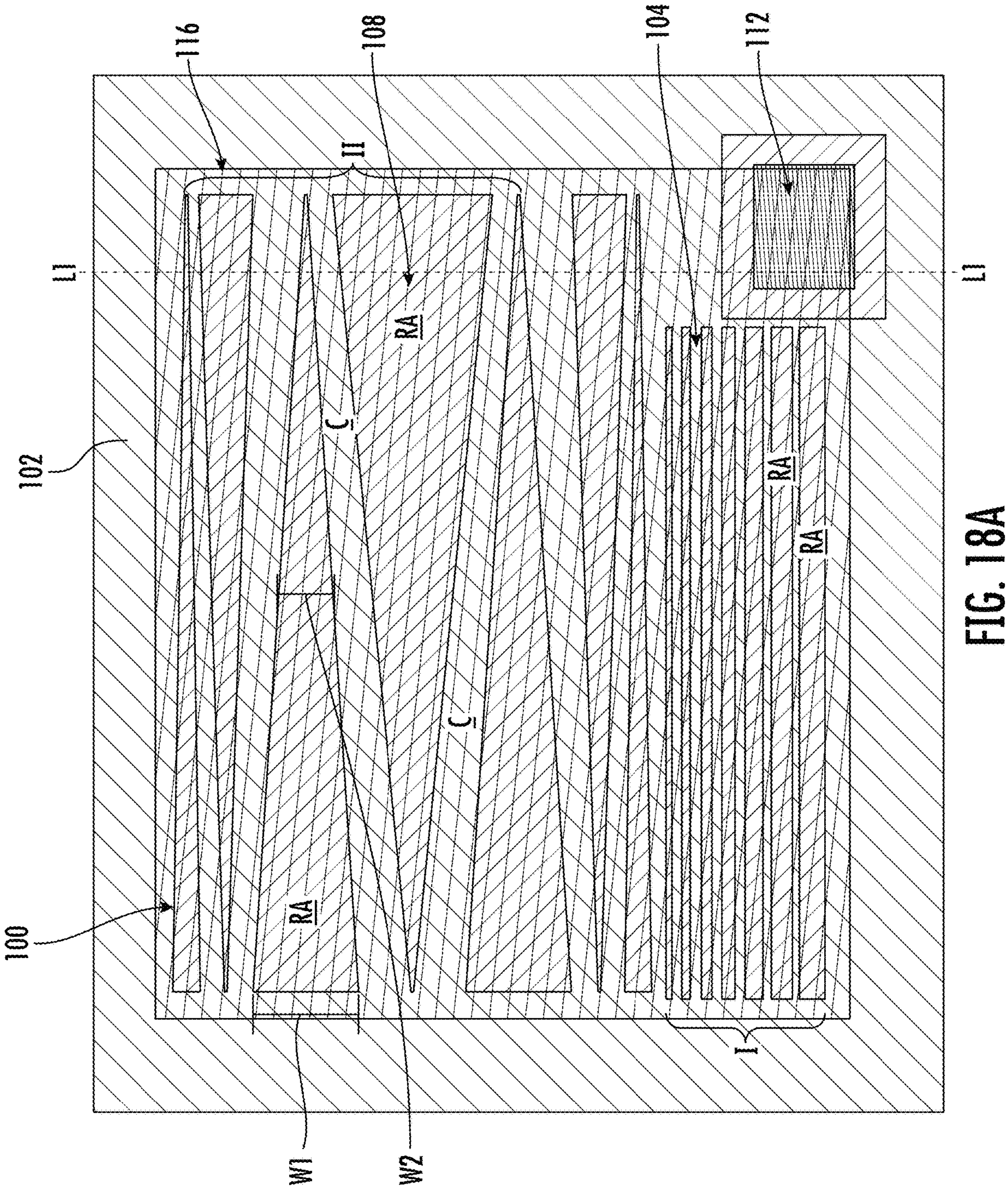
FIG. 18A is a schematic illustration of another exemplary device in accordance with the present disclosure.
Figure 18B:
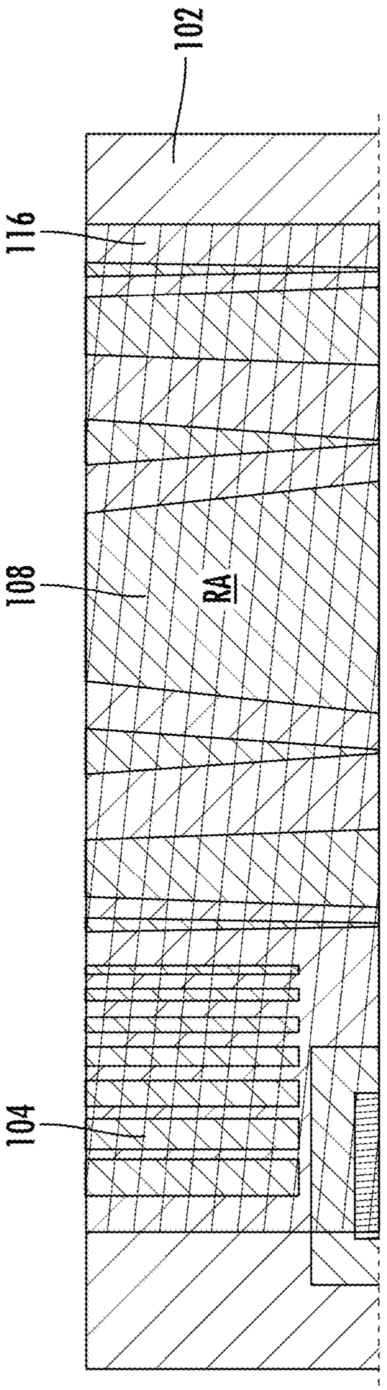
FIG. 18B is an enlarged portion of FIG. 18A.
Figure 18C:
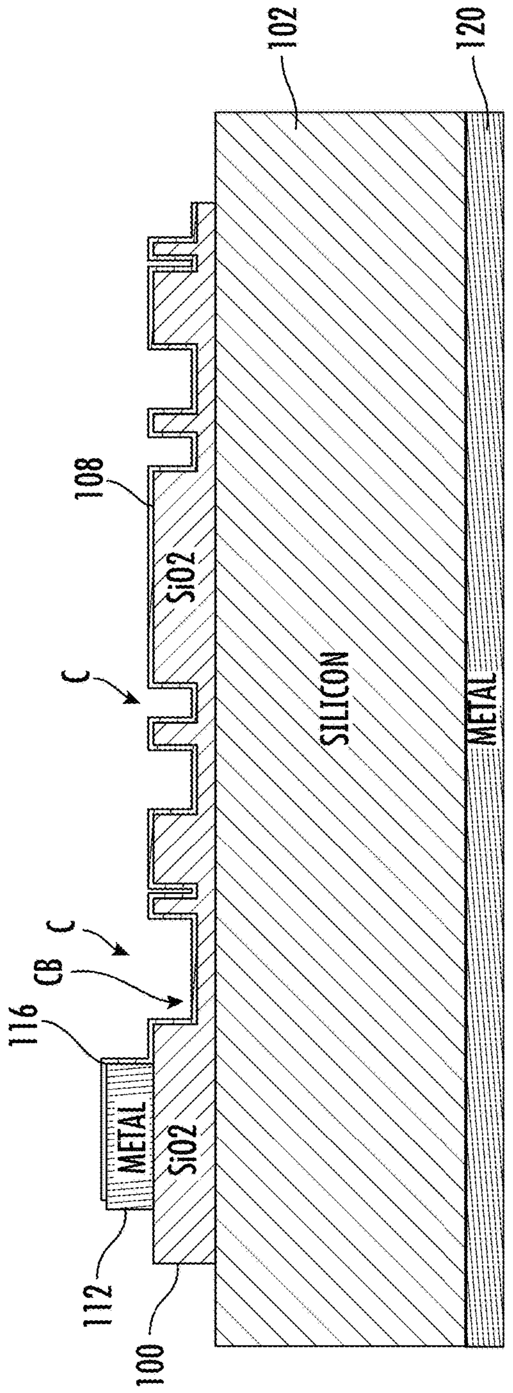
FIG. 18C is a cross-sectional view taken along line L1-L1 in FIG. 18A.

As shown in FIGS. 18A-18C, a patterned structure comprises an insulation layer 100 comprising raised areas RA formed on the surface of a silicon chip 102. The insulating layer 100 can comprise SiO2, for example, as previously described. According to this aspect of the disclosure, the insulating layer 100 comprises raised areas RA formed as a combination of a plurality of alternating rectangular fingers 104 of varying widths, as well as a plurality of alternating generally triangularly shaped fingers 108 of varying widths. As shown, the rectangular fingers 104 can be grouped together in a first group I of a first shape type, and the triangularly shaped fingers 108 can be grouped together in a second group II of a second shape type.

As shown in FIGS. 18A-18C, channels C are formed between at least some of the adjacent rectangular fingers 104 and/or generally triangularly shaped fingers 108. These channels C can have a thin layer of an insulating material, which may be for example SiO2, formed on the channel base CB as shown in FIG. 18C. The thin layer of SiO2 is not shown in the overhead view of FIGS. 18A and 18B so that the shapes of the raised areas RA of the SiO2 layer can be illustrated. The thin layer of SiO2 has a thickness less than the thickness of the silicon oxide layer of the raised areas. The thin layer of SiO2 may have a thickness in the range of 0 nm to 20 nm.

As shown in FIGS. 18A-18C, the generally triangularly shaped fingers 108 are positioned and oriented such that a wider width W1 of a first generally triangularly shaped finger 108 is positioned adjacent a narrower width W2 of a second generally triangularly shaped finger 108 positioned adjacent to a side of the first generally triangularly shaped finger 108. Put another way, one generally triangularly shaped finger 108 may be positioned adjacent another generally triangularly shaped finger 108 such that one width of one of the generally triangularly shaped fingers 108 is increasing while extending from one side of the device to the other, while the other width is decreasing while extending from one side of the device to the other. This provides for the arrangement where opposing angled side surfaces of the generally triangularly shaped fingers 108 are positioned in a complementary arrangement.

It is appreciated that the generally triangularly shaped fingers 108 could also be formed having angled sidewalls with flat ends.

A top metal contact 112 is formed on the insulating layer 100, and a 2D material layer 116, which may be graphene, is formed on top of the insulating layer 100 and top contact 112. A bottom contact 120 is provided on a bottom side of the silicon chip 102 opposite the top contact 112.

Figure 19A:
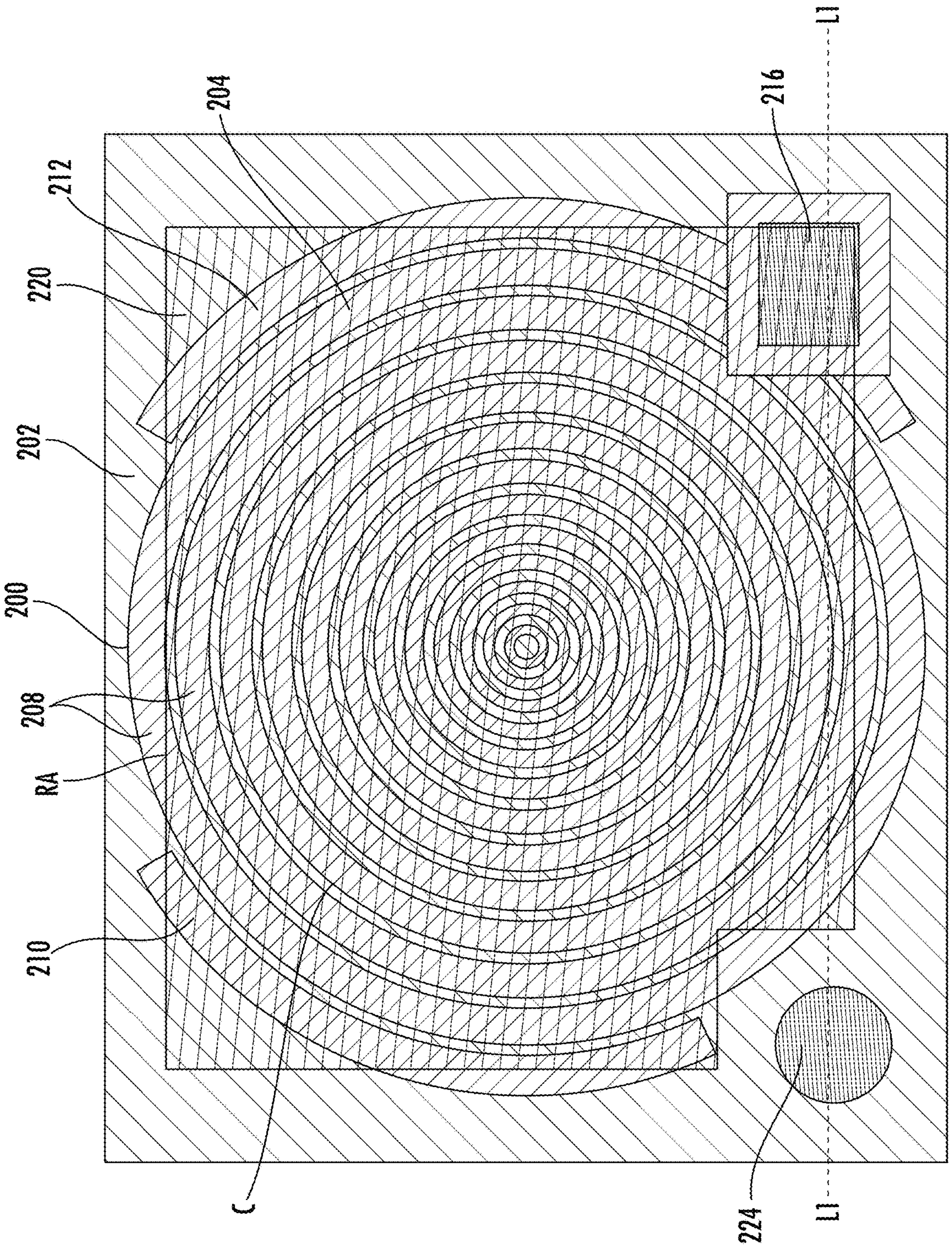
FIG. 19A is a schematic illustration of another exemplary device in accordance with the present disclosure.
Figure 19B:
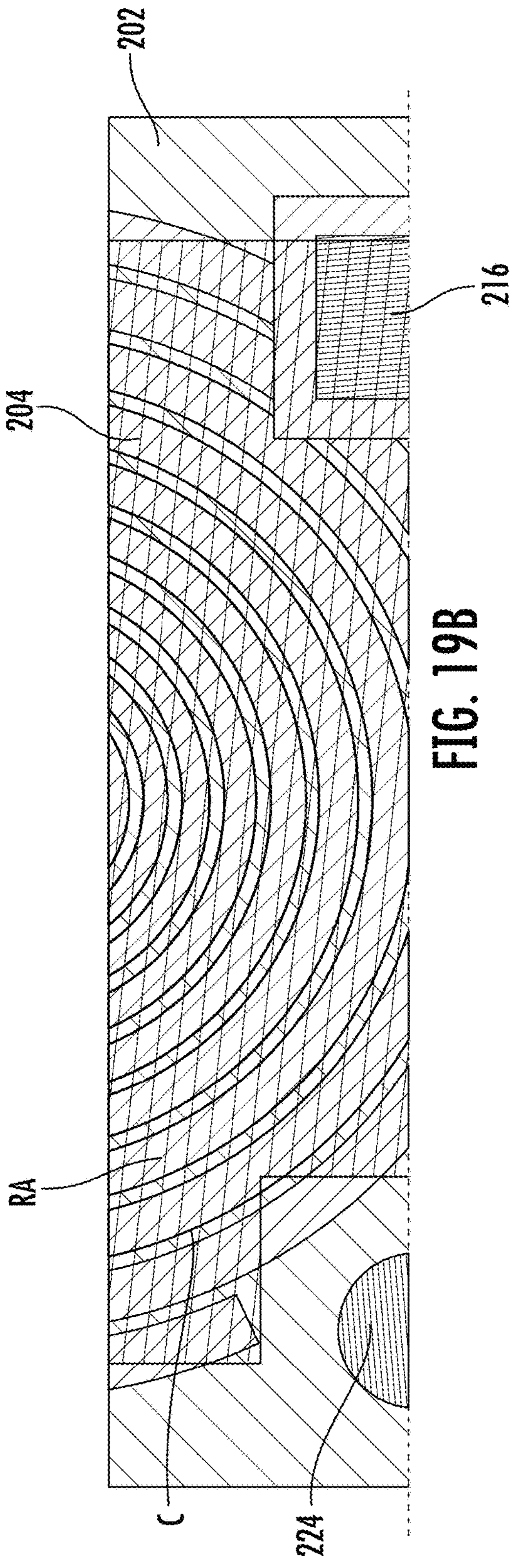
FIG. 19B is an enlarged portion of FIG. 19A.
Figure 19C:
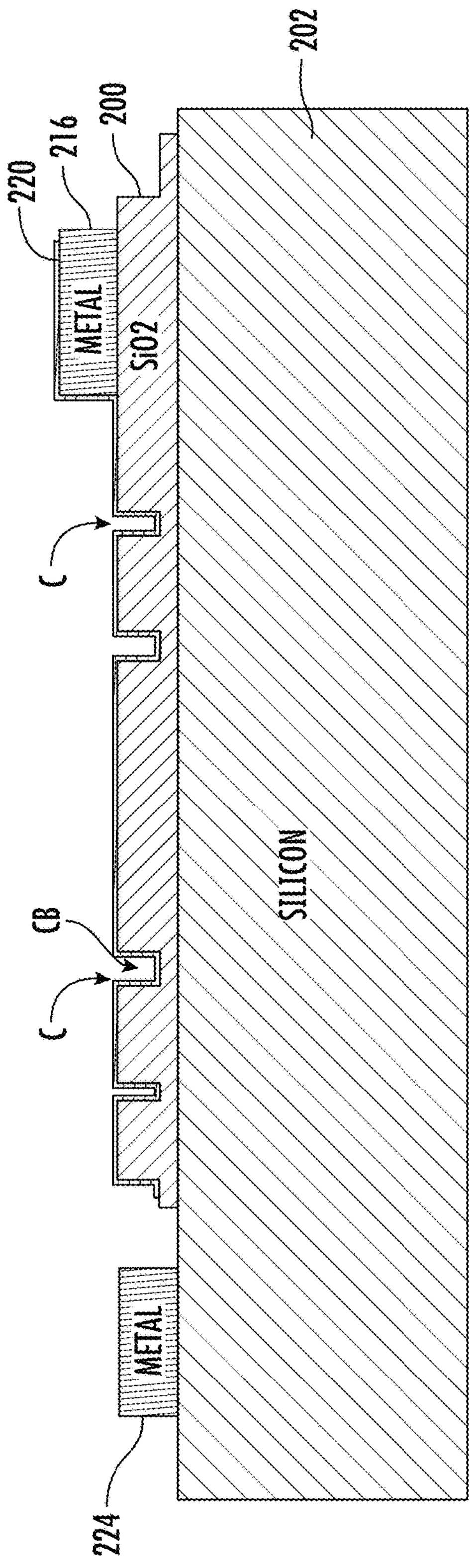
FIG. 19C is a cross-sectional view taken along line L1-L1 in FIG. 19A.

As shown in FIGS. 19A-19C, an insulation layer 200 comprises raised areas RA formed on the surface of a silicon chip 202. The insulating layer 200 comprises SiO2, for example, as previously described. According to this aspect of the disclosure, the insulating layer 200 comprises raised areas RA formed as curved, curving, arced or arcing fingers 204 of varying widths. The curved fingers 204 can be generally circular in shape, and formed as concentric circles 208. In the example shown in FIGS. 19A-19C, the curved fingers 204 form complete concentric circles 208 with the inner-most concentric circle 208 having the smallest diameter, and the outer-most concentric circle 208 having the largest diameter. It is appreciated that at least one or more of the curved fingers 204 can be formed as arcs or partial portions of a circle. For example, in FIGS. 19A-19C, a first curved portion 210 and a second curved portion 212 are formed as arcs adjacent the outer-most concentric circle 208.

As shown in FIGS. 19A-19C, channels C are formed between at least some of the adjacent curved fingers 204 and/or arcs 210/212. These channels C can have a thin layer of SiO2 formed on the channel base CB as shown in FIG. 19C. The thin layer of SiO2 is not shown in the overhead view of FIGS. 19A and 19B so that the shapes of the raised areas RA of the SiO2 layer can be illustrated.

A first top metal contact 216 is formed on the insulating layer 200, and a 2D material layer 220, which may be graphene, is formed on top of the insulating layer 200 and first top metal contact 216. A second top contact 224 is also provided on the silicon chip 202. The second top contact 224 is isolated from the 2D material layer 220.

Each of the curved fingers 204 has a different width, although this is not required. Spacing between the curved fingers 204 is uniform, although in some embodiments the spacing between respective adjacent curved fingers 204 can be different. The illustrated curved fingers 204 have smooth inner and outer radial side profiles, but other profiles are possible such as zigzag or wave-like profiles.

Although the patterned structures depicted in FIGS. 18A-19C include triangular, rectangular and arcuate structures, other geometric structures such as cones, parallelograms, etc. are contemplated. In other embodiments, the patterned structure can include a lattice or other similar structure. In still other embodiments, the patterned structure can be replaced in whole or in part by a freeform structure.

Aspects of the present disclosure can include other types of packages upon final assembly, such as TO hermetic sealed packages, leadframe assemblies, premolded leadframe assemblies, partially overmolded, etc.

Various types of materials and components may be arranged and used to provide a package or packaging (such as an encapsulation) for a photodetector according to the present disclosure. Such a package is generally required for commercial usage of a photodetector such as a photodetector according to the present disclosure. Such a package not only protects the photodetector device (or "chip") itself, but also enables assembly processes by end users (e.g., connecting, such as by soldering, the devices to printed circuit boards).

Various forms of packages that may house a photodetector according to the present disclosure are shown in FIGS. 20A-D.

Figure 20A:
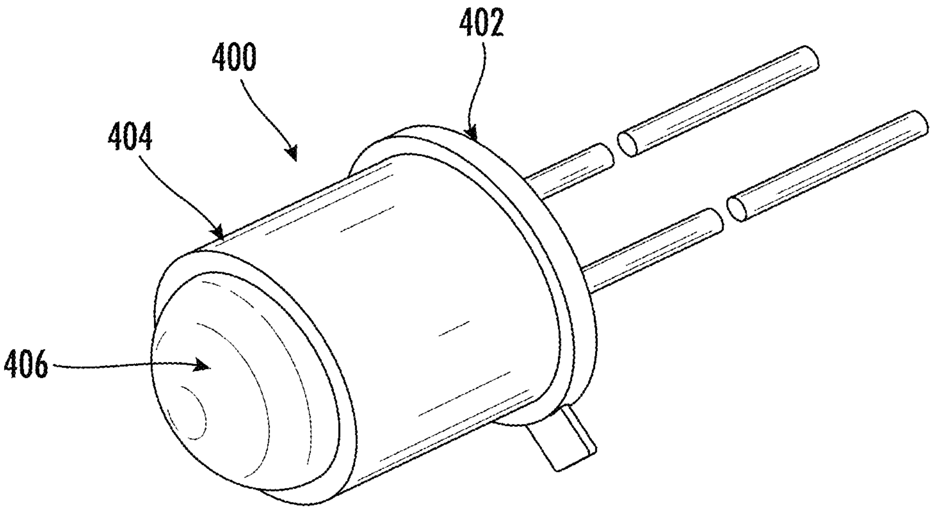
FIG. 20A is a perspective view of an example type of packaging in accordance with the present disclosure.

As shown in FIG. 20A, one type of package 400 may utilize metal can technology. In this technology, the photodetector ("chip") (not shown) is mounted on a metallic header 402. A cap 404 seals the chip inside. The cap 404 includes a glass cover 406 that is transparent for the required wavelengths. The glass cover 406 may be shaped as a lens or a flat glass. It is also possible to have a cap without glass, and fill the inside with a suitable material (such as a potting material), which may be for example silicone, to encapsulate the chip. An example of such a package can be seen in the VISHAY® TSTS7300 Infrared Emitting Diode.

Figure 20B:
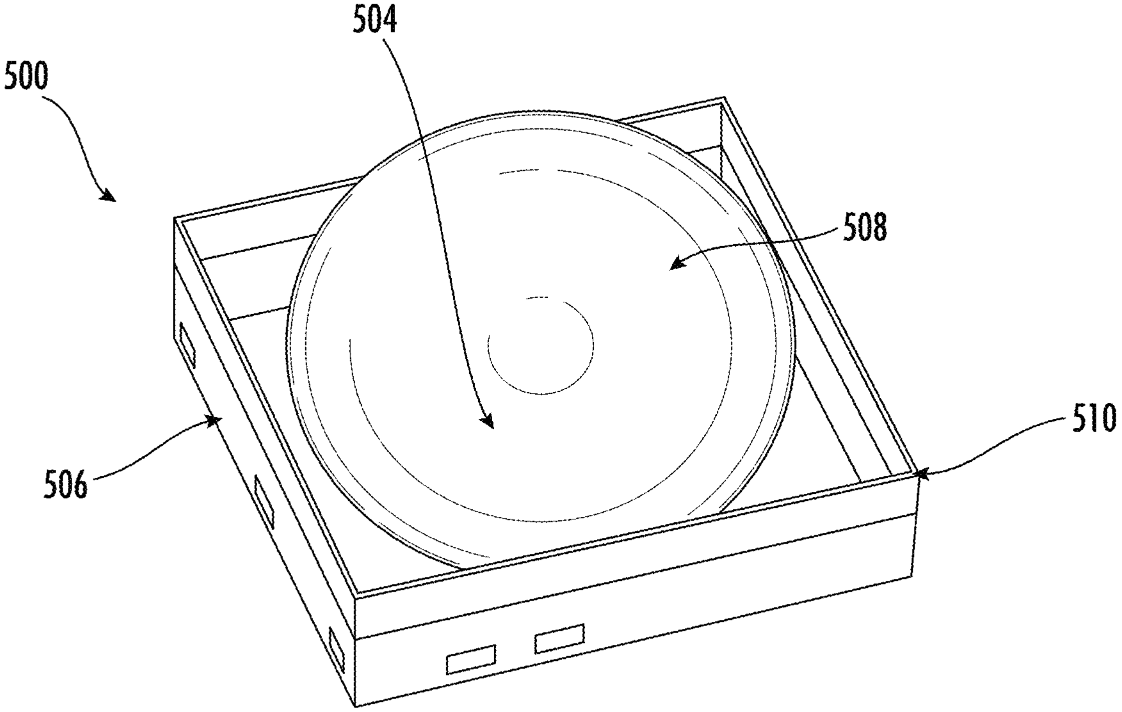
FIG. 20B is a perspective view of another example type of packaging in accordance with the present disclosure.
Figure 20C:
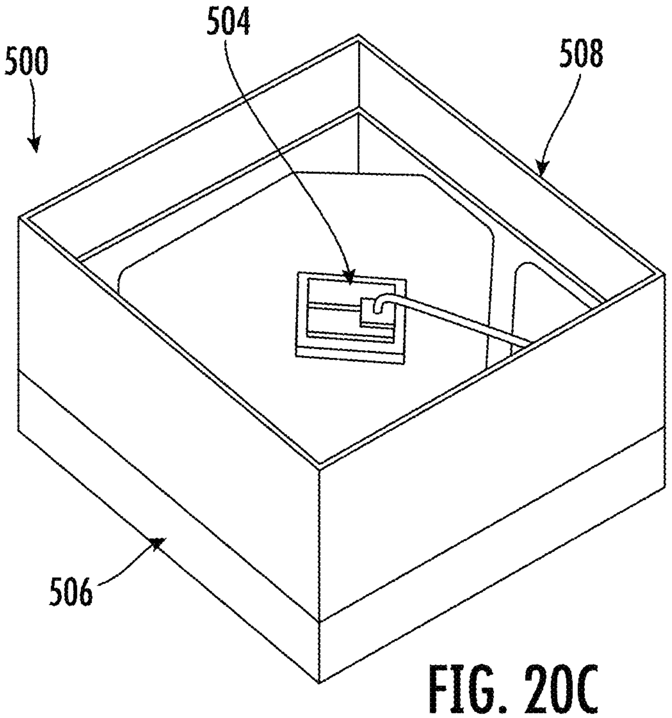
FIG. 20C is a perspective view of another example type of packaging in accordance with the present disclosure.

Another type of package 502 may utilize mold technology, as shown in FIG. 20B. The chip 504 is mounted on a carrier 506 and encapsulated by a suited material, such as silicone 508, or a combination of suitable materials. The carrier 506 can be a metallic leadframe. The lead frame can optionally be at least partially encapsulated by a suited material 510, such as epoxy or silicone. An example of such a package can be seen in the VISHAY® VSMA1085250 High Power Infrared Emitting Diode. The carrier 506 can be a ceramic material with metal pads or printed circuit board, as shown in FIG. 20C. An example of such a package can be seen in the VISHAY® VLMU1610-365-135 UV SMD LED With Silicone Lens.

Figure 20D:
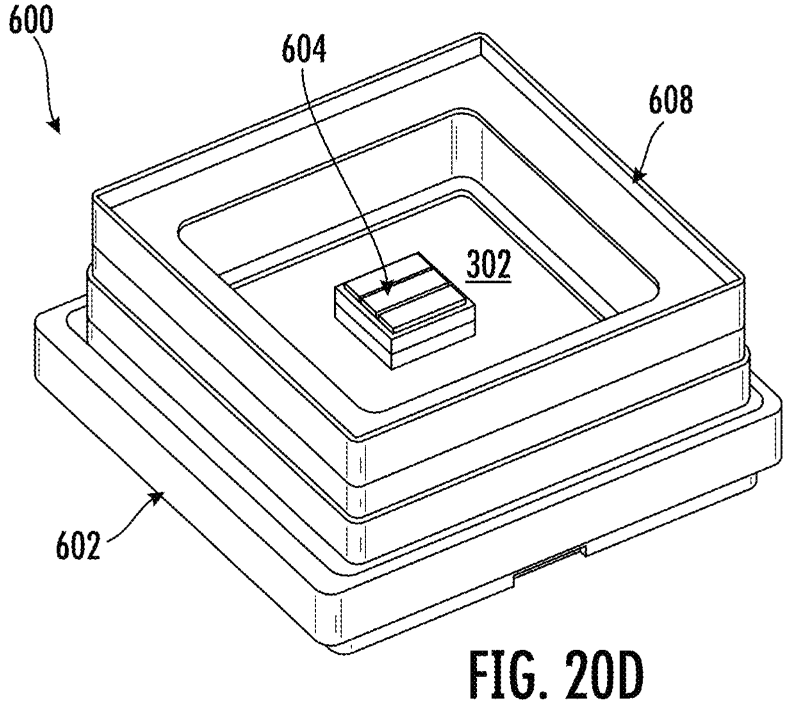
FIG. 20D is a perspective view of another example type of packaging in accordance with the present disclosure.

Another type of package 600 may utilize ceramic-metal-technology, as shown in FIG. 20D. As a substrate, a ceramic material 602 with metal pads is provided. The chip 604 is mounted on the substrate and then sealed by attaching a metallic cap 608 on top of the substrate. This may be performed in ambient conditions or in vacuum. The cap has a glass 610 on top that is transparent for the required wavelengths. An example of such a package can be seen in the VISHAY® VLMU35CT20-275-120, VLMU35CT21-275-120 UVC Emitting Diode in SMD Package.

The packages shown and described herein are provided as examples and should not be seen as limiting. Those of skill in the art would appreciate other suitable arrangements for packaging a photodetector according to the present disclosure.

In the above examples, the channels C of the patterned structure include a thin layer of, for example, SiO2. This thin layer can be formed by any suitable method such as, for example, native SiO2, SiO2 thermal growth, chemical vapor deposition, physical vapor deposition, etc. In some constructions, the raised areas RA are first formed by patterning the SiO2 layer by removing material to form the channels C and exposing the substrate in the channels C. The thin layer of SiO2 is then formed in the channels C. In other constructions, the thin layer is formed by removing only a portion of the SiO2 layer during patterning.

By applying graphene onto a semiconductor in accordance with aspects of the present disclosure, a Schottky diode is created due to some of graphene's properties being similar to properties of a metal. Due to graphene's transparency, light can enter the device, be absorbed in the space charge region (that is directly on the surface of silicon chip 30) and generate an electron-hole pair that can contribute to a photocurrent. Compared to conventional silicon photodetector devices, photodetector devices in accordance with the present disclosure have been shown to have 30% or greater photocurrent at 400 nm illumination and 100% or greater photocurrent at 260 nm illumination.

As mentioned previously, aspects of the present disclosure are directed to photodetectors having a variety of patterned structures. Certain patterned structures have been found to enhance photosensitivity of the photodetector and/or optimize the photosensitivity of the photodetector for certain wavelengths of light, such as certain wavelengths within the UV spectrum.

Although the features and elements of the present invention are described in the example embodiments in particular combinations, each feature may be used alone without the other features and elements of the example embodiments or in various combinations with or without other features and elements of the present invention. Changes in the form and the proportion of components or parts as well as in the substitution of equivalents are contemplated as circumstances may suggest or render expedient without departing from the spirit or scope of the invention.

The foregoing descriptions have been presented for purposes of illustration and description. They are not intended to be exhaustive or to limit the invention to the precise forms disclosed, and many modifications and variations are possible in light of the above teachings. The invention is to be construed according to the claims and their equivalents.

What is claimed is:

1. An optoelectronic semiconductor device, comprising:

a semiconductor substrate;

an insulating layer comprising a patterned structure provided on a first side of the semiconductor substrate, the patterned structure comprising a plurality of raised areas with at least two channels formed between adjacent, spaced apart raised areas, wherein one of the plurality of raised areas is a connecting portion from which the adjacent, spaced apart raised areas extend;

a layer of an insulating material provided on a surface of at least one of the at least two channels;

a first contact positioned only on a surface of the connecting portion;

at least one 2D material layer provided on at least portions of each of the insulating layer and the semiconductor substrate, the at least one 2D material layer in contact with the first contact; and a second contact provided on a second side of the semiconductor substrate.

2. The optoelectronic semiconductor device of claim 1, wherein the insulating layer comprises an oxide layer.

3. The optoelectronic semiconductor device of claim 2, wherein the layer of insulating material provided on the surface of at least one of the at least two channels comprises an oxide layer.

4. The optoelectronic semiconductor device of claim 3, wherein the raised areas of the patterned structure have a first thickness, and the insulating material provided on the surface of at least one of the channels has a second thickness, and wherein the first thickness is greater than the second thickness.

5. The optoelectronic semiconductor device of claim 2, wherein the patterned structure comprises at least one of interdigitated fingers, triangular fingers, at least partially curved fingers, or a combination of any of those.

6. The optoelectronic semiconductor device of claim 1, wherein the patterned structure comprises a combination of fingers having a first shape type and having a second shape type different than the first shape type.

7. The optoelectronic semiconductor device of claim 2, wherein the semiconductor substrate comprises a n-doped silicon, and wherein the oxide layer comprises silicon oxide.

8. The optoelectronic semiconductor device of claim 2, wherein the oxide layer comprises a thermally grown silicon oxide layer having a thickness of about 20 nm.

9. The optoelectronic semiconductor device of claim 1, wherein at least one of the first contact or the second contact comprises a Ti layer having a thickness of about 20 nm, and a Ni layer having a thickness of about 200 nm.

10. The optoelectronic semiconductor device of claim 1, further comprising a header.

11. The optoelectronic semiconductor device of claim 1, further comprising a package, the package comprising a transparent material configured to allow transmission of light.

12. A method of forming an optoelectronic semiconductor device, the method comprising:

forming a semiconductor substrate;

forming an insulating layer comprising a patterned structure provided on a first side of the semiconductor substrate, the patterned structure comprising a plurality of raised areas with at least two channels formed between adjacent, spaced apart raised areas, wherein one of the plurality of raised areas is a connecting portion from which the adjacent, spaced apart raised areas extend;

forming a layer of an insulating material on a surface of at least two channels;

forming a first contact positioned only on a surface of the connecting portion;

forming at least one 2D material layer on at least portions of each of the insulating layer and the semiconductor substrate, the at least one 2D material layer in contact with the first contact; and forming a second contact provided on a second side of the semiconductor substrate.

13. The method of claim 12, wherein the insulating layer comprises a thermally grown a silicon oxide layer.

14. The method of claim 12, further comprising using optical lithography and wet etching to form the patterned structure.

15. The method of claim 13, wherein forming the first contact comprises sputtering at least one metal layer on the silicon oxide layer.

16. The method of claim 15, wherein sputtering at least one metal layer comprises sputtering a Ti layer having a thickness of about 20 nm, and sputtering a Ni layer having a thickness of about 200 nm.

17. The method of claim 13, wherein forming the 2D material layer comprises growing a graphene layer on copper by chemical vapor deposition and transferring the graphene layer onto at least portions of each of the semiconductor substrate, the silicon oxide layer and the first contact.

18. The method of claim 17, further comprising patterning the graphene layer.

19. The method of claim 18, wherein patterning the graphene layer comprises reactive ion etching.

20. The method of claim 12, further comprising providing a package enclosing at least a portion of the optoelectronic semiconductor device, the package comprising a transparent material configured to allow transmission of light.

* * * * *